United States Patent [19]
Schiele

[11] Patent Number: 5,931,173
[45] Date of Patent: Aug. 3, 1999

[54] MONITORING CLEANING EFFECTIVENESS OF A CLEANING SYSTEM

[75] Inventor: Norman K. Schiele, Round Rock, Tex.

[73] Assignee: Cypress Semiconductor Corporation, San Jose, Calif.

[21] Appl. No.: 08/871,428

[22] Filed: Jun. 9, 1997

[51] Int. Cl.[6] ........................................... B08B 3/12
[52] U.S. Cl. .................. 134/57 R; 134/113; 134/184; 134/902
[58] Field of Search .................. 134/1, 1.3, 18, 134/57 R, 57 D, 113, 184, 186, 902; 68/355

[56] References Cited

U.S. PATENT DOCUMENTS

| | | | |
|---|---|---|---|
| 4,326,553 | 4/1982 | Hall | 134/153 |
| 4,543,130 | 9/1985 | Shwartzman | 134/1 |
| 4,736,759 | 4/1988 | Coberly et al. | 134/66 |
| 4,736,760 | 4/1988 | Coberly et al. | 134/134 |
| 4,869,278 | 9/1989 | Bran | 134/184 |
| 5,037,481 | 8/1991 | Bran | 134/1 |
| 5,090,432 | 2/1992 | Bran | 134/139 |
| 5,148,823 | 9/1992 | Bran | 134/184 |
| 5,247,954 | 9/1993 | Grant et al. | 134/184 |
| 5,286,657 | 2/1994 | Bran | 437/9 |
| 5,365,960 | 11/1994 | Bran | 134/184 |
| 5,427,622 | 6/1995 | Stanasolovich et al. | 134/1 |
| 5,520,205 | 5/1996 | Guldi et al. | 134/98.1 |
| 5,533,540 | 7/1996 | Stanasolovich et al. | 134/155 |
| 5,534,076 | 7/1996 | Bran | 134/1 |
| 5,579,792 | 12/1996 | Satanasolovich et al. | 134/184 |

FOREIGN PATENT DOCUMENTS

0 546 685 A2  6/1993  European Pat. Off. .

OTHER PUBLICATIONS

A. Mayer, "Development of Megasonic Cleaning for Silicon Wafers," Quarterly Report No. 2, U.S. Department of Energy, DOE/JPL/955342–2, Oct. 1, 1979, pp. i–iv and 1–17.

A. Mayer, "Development of Megasonic Cleaning for Silicon Wafers," Quarterly Report No. 4, U.S. Department of Energy, DOE/JPL–955342–79/4, Apr. 1, 1980, pp. i–vi and 1–19.

A. Mayer, "Development to Megasonic Cleaning for Silicon Wafers," Final Report, U.S. Department of Energy, DOE/JPL–955342–79/2, Sep. 1980, pp. i–x and 1–88.

(List continued on next page.)

*Primary Examiner*—Philip R. Coe
*Attorney, Agent, or Firm*—David R. Graham

[57] ABSTRACT

The invention can be used to monitor the cleaning effectiveness of a cleaning system in which vibrations (such as, for example, vibrations having a megasonic or ultrasonic frequency) are applied to a volume of fluid (e.g., water) in which an object to be cleaned (e.g., a substrate, such as semiconductor wafer or other semiconductor substrate) is at least partially immersed. Generally, the invention monitors the state of a physical characteristic of the fluid during the application of the vibrations, thus providing a more direct and accurate measure of the effectiveness of the cleaning than has heretofore been obtainable. For example, the magnitude of the acceleration of a pressure wave produced in the volume of fluid by the vibrations can be monitored, thus enabling the amplitude and/or frequency of the pressure wave to be determined. Or, the formation of bubbles on a surface that is immersed in the fluid can be detected in a manner that enables the size and/or the frequency of formation of such surface bubbles to be determined. These quantities can be used to evaluate the effectiveness of the cleaning. The invention can be used, for example, during installation of a cleaning system, during qualification of a cleaning method, or as part of scheduled or diagnostic maintenance of a cleaning system. Further, the invention can be implemented with a cleaning system or method so as to enable control of the system or method in response to the evaluation of cleaning effectiveness, thus enabling real-time control of the cleaning system or method so as to increase the cleaning effectiveness of the system or method.

26 Claims, 6 Drawing Sheets

OTHER PUBLICATIONS

G. Gale et al., "How to Accomplish Effective Megasonic Particle Removal," Semiconductor International, Aug. 1996, pp. 133, 134, 136 and 138.

C.J. Gow et al., "A Method for Evaluating Cleaninag Techniques for the Removal of Particulates from Semiconductor Surfaces," Proceedings of the 2nd International Symposium on Cleaning Technology in Semiconductor Device Manufacturing, 1992, pp. 366–371.

Product information on VERTEQ Megasonic Cleaning Systems, 4 pages.

MONITORING CLEANING EFFECTIVENESS OF A CLEANING SYSTEM

BACKGROUND OF THE INVENTION

1. Field of the Invention

This invention relates to monitoring the cleaning effectiveness of cleaning systems and methods in which vibrations (e.g., vibrations having a megasonic or ultrasonic frequency) are applied to a volume of fluid in which an object to be cleaned is at least partially immersed.

2. Related Art

It is sometimes necessary or desirable to clean particles (particularly small particles) from the surface of an object. For example, during processing of a semiconductor substrate (e.g., a semiconductor wafer) to form a device incorporating that substrate (e.g., an integrated circuit chip), it is typically necessary to clean the surfaces of the substrate to remove particles and other contamination on the substrate surfaces. It has been demonstrated that the surfaces of an object such as a semiconductor substrate can be cleaned by applying vibrations to a volume of fluid in which the object is immersed. In particular, vibrations having a megasonic or ultrasonic frequency have been used in cleaning systems and methods of this type. Such cleaning systems are well known and are described in, for example, Ahmed A. Busnaina et al., "An Experimental Study of Megasonic Cleaning of Silicon Wafers," *J. Electrochem. Soc.*, Vol. 142, No. 8, August 1995, pp. 2812–2817; C. J. Gow et al., "A Method for Evaluating Cleaning Techniques for the Removal of Particulates from Semiconductor Surfaces," *Proceedings of the 2nd International Symposium on Cleaning Technology in Semiconductor Device Manufacturing*, 1992, pp. 366–371; and Glenn Gale et al., "How to Accomplish Effective Megasonic Particle Removal," *Semiconductor International*, August 1996, pp. 133–136 and page 138, the disclosures of which are incorporated by reference herein.

FIG. 1 is a perspective view of part of a typical dump rinser 100 that can be used to clean an object by vibrating a fluid in which the object is immersed. One or more substrates 101 (multiple substrates are shown in FIG. 1, though this need not necessarily be the case) are positioned in a substrate carrier 102. The substrates 101 can be, for example, semiconductor wafers. The substrate carrier 102 is positioned within a tank 103 which is filled with water (e.g., deionized water), such that the substrates 101 are immersed in the water. As explained further below with respect to FIG. 2, one or more transducers 104 are excited at a predetermined frequency (such as a megasonic or ultrasonic frequency) to produce vibrations that cause pressure waves (shown pictorially in FIG. 1 by the dark arrows) in the water that effect removal of particles from the surfaces of the substrates 101.

FIG. 2 is a block diagram of a typical megasonic dump rinser 200. A system controller 201 (e.g., any conventional digital computing device including a mechanism for operator input and a display) enables an operator to input instructions for operation of the megasonic dump rinser 200. An electrical signal from a power supply 202 is input to each of two conventional RF generators 204a and 204b. Each of the RF generators 204a and 204b convert the corresponding electrical signal to an electrical signal having a radio frequency in accordance with instructions transmitted from the system controller 201 to the RF generator 204a or 204b. The electrical signal output from each of the RF generators 204a and 204b is input to a corresponding conventional balun transformer 205a or 205b. Each of the balun transformers 205a and 205b impedance matches the input signal to enable production of an electrical signal from the balun transformer 205a or 205b having maximum power. The electrical signal output from each of the balun transformers 205a and 205b is input to a corresponding transducer 206a or 206b. Each of the transducers 206a and 206b transforms the input electrical signal into a mechanical signal (i.e., vibrations) having the same frequency as the input electrical signal. (Herein, "radio frequency" may be used when referring to an electrical signal having such frequency, while "megasonic frequency" may be used when referring to a mechanical quantity, such as vibrations, having such frequency.) The transducers 206a and 206b, which operate in a manner similar to an audio speaker, may each be implemented by, for example, a plate including piezoelectric elements, vibration of the plate being produced in response to input of the electrical signal to the piezoelectric elements. Though two sets of an RF generator, balun transformer and transducer are shown in FIG. 2, one, three or more sets can be used.

The transducers 206a and 206b are positioned in a tank 207 which is filled with water 208, such that the transducers 206a and 206b are immersed (at least partly and typically entirely) in the water 208. One or more substrates 203 are also positioned in the tank 207 so that the substrates 203 are immersed (at least partly and usually entirely) in the water 208. The vibrations of the transducers 206a and 206b produce pressure waves in the water 208, resulting in alternating periods (which occur at the same frequency as that of the vibrations) of high and low pressure at the surfaces of the substrates 203. The agitation produced at the substrate surfaces by the pressure waves causes particles on the substrate surfaces to be dislodged, thereby cleaning the substrate surfaces.

During periods of low pressure, bubbles can be formed by cavitation (i.e., cavities are formed which fill with vapor or gas) on surfaces in the water 208 that are perpendicular to the direction of motion of the pressure wave. A subsequent high pressure part of the pressure wave can cause the bubbles to collapse. The increased agitation produced at such surfaces by the formation and collapse of bubbles aids in dislodgement of particles from those surfaces. Thus, the substrates 203 are preferably positioned in the water 208 such that the substrate surfaces to be cleaned are perpendicular (or substantially perpendicular) to the direction of motion of the pressure wave, so that the cleaning of the substrate surfaces can be enhanced by the above-described bubble formation and collapse.

Previously, cleaning effectiveness during a megasonic cleaning process has been monitored by monitoring the power output from the RF generator(s), it being assumed that cleaning effectiveness increases directly with the magnitude of RF generator power output. If the RF generator power output remains above a specified magnitude, cleaning is deemed to be adequate; if the power output decreases below the specified magnitude, cleaning is considered to be inadequate.

However, the magnitude of the RF generator power output may not be an accurate indicator of cleaning effectiveness. For example, the installation of the mechanical parts of a megasonic cleaning system (e.g., the mounting of the tank that holds the cleaning fluid), the physical characteristics of the electrical cabling of a megasonic cleaning system, or degradation of the operation of an aspect of a megasonic cleaning system (e.g., degradation of transducer operation over time, such as may occur, for example, if a transducer mount loosens or an electrical short occurs in a transducer) may change the relationship between RF generator power output and cleaning effectiveness, such that maximum cleaning effectiveness is obtained at other than the maximum RF generator power output or such that inadequate cleaning effectiveness (though the maximum cleaning effectiveness) is obtained at the maximum RF generator power output. Moreover, even if maximum and/or adequate cleaning effectiveness is initially obtained at maximum RF generator power output, over time this relationship may not hold; in particular, cleaning effectiveness may degrade even though a corresponding decrease in RF generator power output has not occurred. Thus, monitoring RF generator power output may not be an adequate means of monitoring the cleaning effectiveness of a megasonic cleaning system.

The effectiveness of megasonic cleaning is believed to be related to the magnitudes of the frequency and amplitude of the pressure wave induced in the cleaning fluid (e.g., water), and, if cavitation occurs, the size (which is related to the amplitude of the pressure wave) and frequency of formation (which is related to the frequency of the pressure wave) of the bubbles formed on surfaces of the objects being cleaned. Currently, there is no way to directly monitor these quantities during operation of a megasonic cleaning system. The ability to monitor the efficacy of a megasonic cleaning process or system would be greatly enhanced by the capability to monitor these quantities. More generally, the capability to monitor such quantities can be useful in monitoring cleaning effectiveness in any cleaning system or method in which vibrations are applied to a volume of fluid in which an object to be cleaned is at least partially immersed.

SUMMARY OF THE INVENTION

The invention can be used to monitor the cleaning effectiveness of a cleaning system in which vibrations (e.g., vibrations having a megasonic or ultrasonic frequency) are applied to a volume of fluid (e.g., water) in which an object to be cleaned (e.g., a substrate, such as semiconductor wafer or other semiconductor substrate) is at least partially immersed. Generally, the invention monitors the state of a physical characteristic of the fluid during the application of the vibrations, thus providing a more direct and accurate measure of the effectiveness of the cleaning than has heretofore been obtainable. For example, the magnitude of the acceleration of a pressure wave produced in the volume of fluid by the vibrations can be monitored, thus enabling the amplitude and/or frequency of the pressure wave to be determined. These quantities, as discussed above, are related to, and thus can be used to evaluate, the effectiveness of the cleaning. Or, as another example, the formation of bubbles on a surface that is immersed in the fluid can be detected in a manner that enables the size and/or the frequency of formation of such surface bubbles to be determined. Again, these quantities can be used to evaluate the effectiveness of the cleaning. The invention can be used, for example, during installation of a cleaning system, during qualification of a cleaning method, or as part of scheduled or diagnostic maintenance of a cleaning system. Since the effectiveness of cleaning systems and methods that use fluid vibrations to effect cleaning can be monitored better than has been possible in the past, the cleaning effectiveness of those systems and methods can be improved. Further, the invention can be implemented with a cleaning system or method so as to enable control of the system or method in response to the evaluation of cleaning effectiveness, thus enabling real-time control of the cleaning system or method so as to increase the cleaning effectiveness of the system or method.

In one embodiment of the invention, a system for cleaning an object that is at least partially immersed in a volume of fluid includes: i) a mechanism for applying vibrations to the volume of fluid, and ii) a mechanism for monitoring the state of a physical characteristic of the fluid during the application of the vibrations. The monitoring mechanism can further include: i) a mechanism for sensing the state of the physical characteristic, and ii) a mechanism for producing information regarding the state of the physical characteristic. The monitoring mechanism can also include a mechanism for evaluating the produced information. The cleaning system can further include a mechanism for controlling the mechanism for applying vibrations, the mechanism for controlling being operable in response to evaluation of the information produced by the monitoring mechanism.

In another embodiment of the invention, a device for use in monitoring the effectiveness of a cleaning process in which vibrations are applied to a volume of fluid in which an object to be cleaned is at least partially immersed includes: i) a mechanism for sensing the state of a physical characteristic of the fluid during the application of the vibrations, and ii) a mechanism for producing information regarding the state of the physical characteristic.

In yet another embodiment of the invention, a method for monitoring the effectiveness of a cleaning process in which vibrations are applied to a volume of fluid in which an object to be cleaned is at least partially immersed includes the steps of: i) sensing the state of a physical characteristic of the fluid during the application of the vibrations, and ii) producing information regarding the state of the physical characteristic.

A sensing mechanism for use with a system, device or method according to the invention can be, for example, a mechanism for determining the acceleration of a pressure wave produced in the volume of fluid by the vibrations. In such case, the mechanism for producing information regarding the state of the physical characteristic can be a mechanism for determining the amplitude and/or frequency of the pressure wave from the determined acceleration. The mechanism for determining the acceleration of the pressure wave can be, for example, a mechanism for directly measuring the acceleration of the pressure wave. Or, the mechanism for determining the acceleration of the pressure wave can be, for example, a mechanism for measuring the acceleration of the mechanism itself (which is submerged within the volume of fluid). Or, the mechanism for determining the acceleration of the pressure wave can be, for example, a mechanism for measuring the acceleration of a wall of an apparatus containing the volume of fluid, whereby the acceleration of the pressure wave produced in the volume of fluid by the vibrations can be determined. The measuring mechanisms can be implemented by, for example, a piezoelectric transducer.

A sensing mechanism for use with a system, device or method according to the invention can also be, for example, a mechanism for detecting the formation of bubbles on a surface that is immersed in the fluid. In such case, the mechanism for producing information regarding the state of the physical characteristic can be a mechanism for determining the size and/or the frequency of formation of such bubbles based upon the detection of bubble formation. A detecting mechanism of this type can be implemented by, for example: i) a mechanism for producing collimated light; ii) a mechanism for directing the light along an axis that is substantially parallel to the surface and at a known distance from the surface, such that the light passes through a specified region; and iii) a mechanism for detecting the intensity of the collimated light after the light has passed through the specified region. In particular, the mechanism for producing collimated light can be a laser diode, the mechanism for directing the collimated light can be a mirror, and the mechanism for detecting the intensity of the collimated light can be a photodetector. In a further embodiment, the detecting mechanism can include a mechanism for varying the distance of the axis from the surface, thus enabling detection of surface bubbles of various sizes.

DETAILED DESCRIPTION OF THE INVENTION

The invention enables the cleaning effectiveness of a cleaning system or method that uses fluid vibrations to effect cleaning to be monitored more effectively than has been possible in the past. The invention can be used with any cleaning system in which vibrations (e.g., vibrations having a megasonic or ultrasonic frequency) are applied to a volume of fluid ("cleaning fluid") in which an object to be cleaned is at least partially immersed. The invention monitors the state of a physical characteristic of the cleaning fluid during the application of the vibrations, the state of the physical characteristic being indicative of the efficacy of the cleaning process. This information can be used to verify acceptable operation of a cleaning system or method, as well as to diagnose problems with the operation of a cleaning system or method. The invention can also be implemented with a cleaning system or method so as to enable control of the system or method in response to the evaluation of information produced regarding the state of the physical characteristic, thus enabling real-time control of the system or method.

Figure 2:
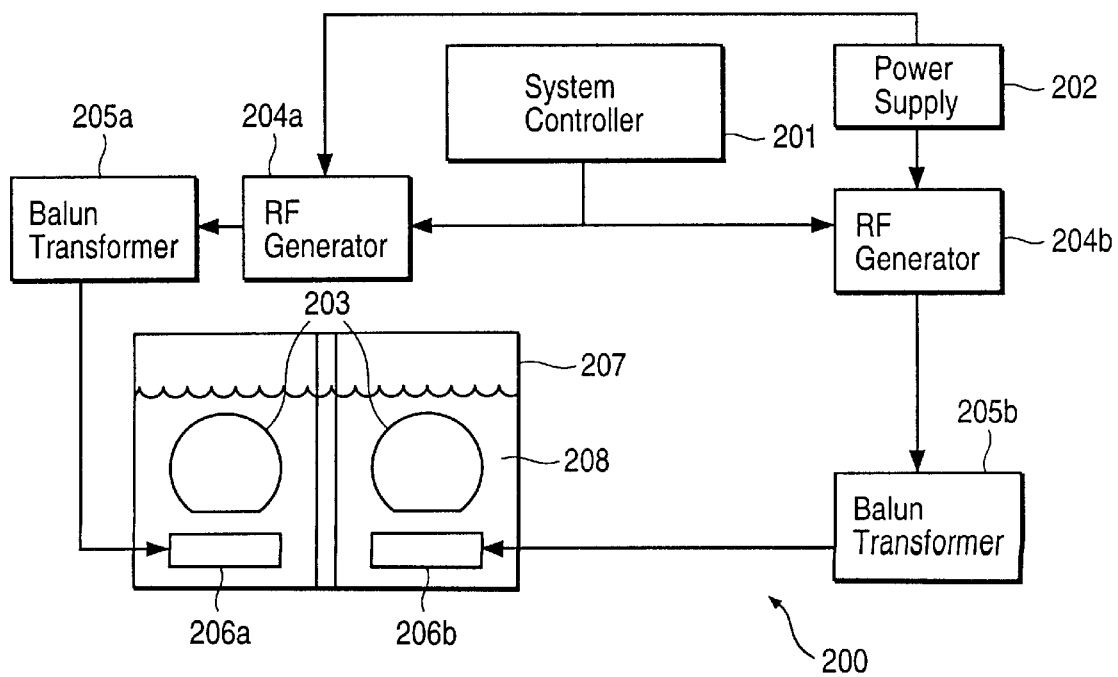
FIG. 2 is a block diagram of a typical megasonic dump rinser.
Figure 3:
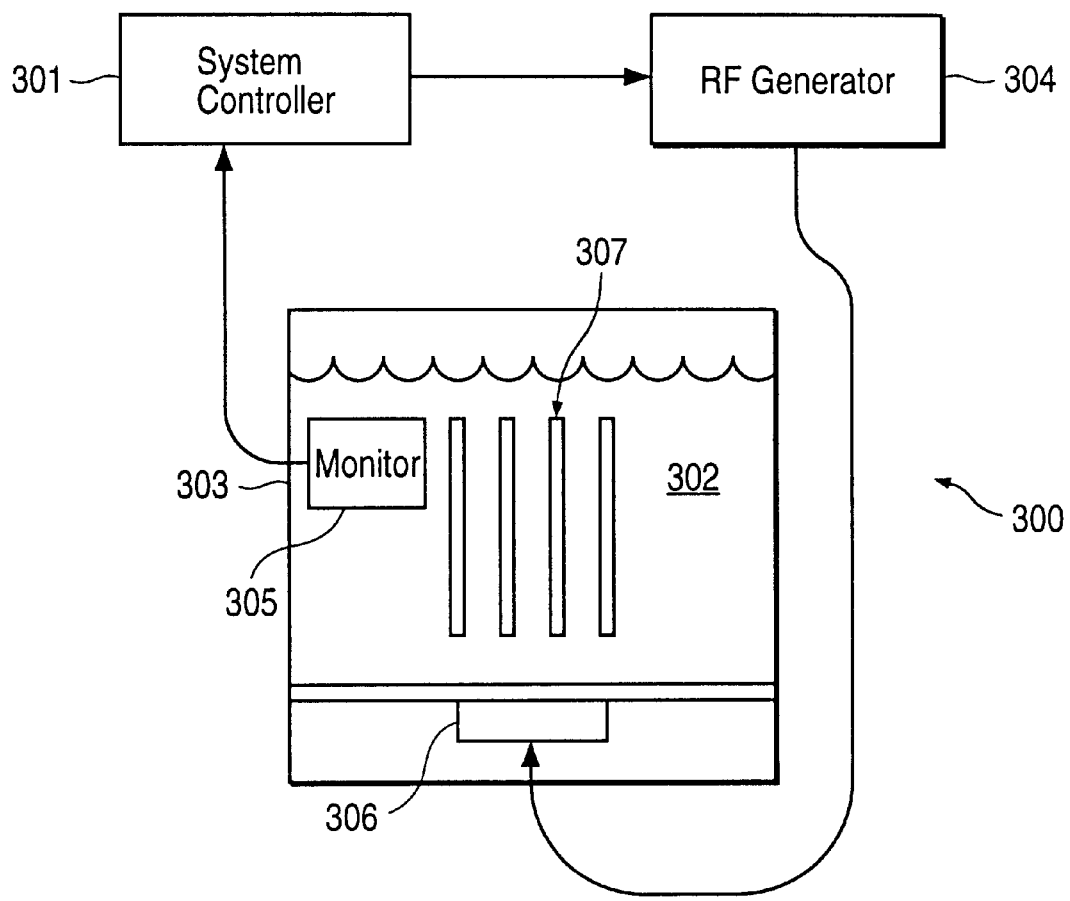
FIG. 3 is a simplified diagram of a cleaning system including a cleaning monitor according to the invention.

FIG. 3 is a simplified diagram of a megasonic cleaning system 300 including a cleaning monitor 305 according to the invention. For simplicity, some components of the megasonic cleaning system 300 are not illustrated in FIG. 3; however, generally, the megasonic cleaning system 300 can be implemented and operated in the same or similar manner as that described above with respect to the megasonic dump rinser 200 of FIG. 2. The megasonic cleaning system 300— with the exception of the cleaning monitor 305, the mechanism for enabling the cleaning monitor 305 to communicate with a system controller 301 (described in more detail below), and any modifications to the system 300 implemented to enable and/or enhance the operation and/or use of the cleaning monitor 305—can be implemented by any of a variety of known megasonic cleaning systems, as identified in more detail below. Though the following description is frequently made with respect to application of the invention to a megasonic cleaning system or method, it should be kept in mind that the invention is generally applicable—with appropriate modification to the particular descriptions of the invention made below with respect to FIGS. 3, 4A, 4B, 5A and 5B, as can be readily apprehended by those skilled in the art—to any system or method in which vibrations are applied to a volume of fluid to effect cleaning of an object that is at least partially immersed in the fluid, such as, for example, an ultrasonic cleaning system or method.

Figure 1:
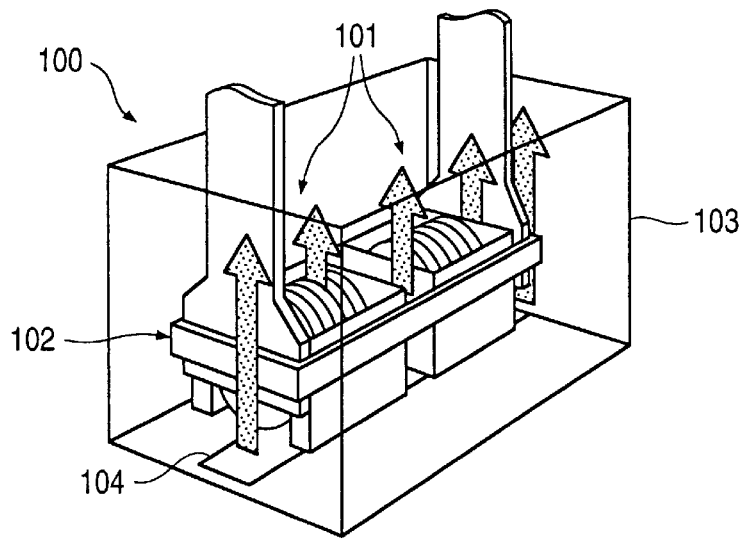
FIG. 1 is a perspective view of part of a typical dump rinser, illustrating how the dump rinser can be used to clean one or more substrates.

As shown in FIG. 3, one or more substrates 307 (as with FIG. 1 above, multiple substrates are shown in FIG. 3, though this need not necessarily be the case) are immersed (at least partly, though typically entirely) in water 302 (which, when the system 300 is used to clean semiconductor substrates, is typically deionized water) in a tank 303. The system controller 301 is used by an operator of the megasonic cleaning system 300 to cause an RF generator 304 to generate an electrical signal having a radio frequency. This electrical signal is input to a transducer 306 which produces vibrations that induce pressure waves in the water 302. The agitation produced at the surfaces of the substrates 307 by the pressure waves causes particles on the substrate surfaces to be dislodged, thereby cleaning the substrate surfaces. The substrates 307 are positioned in the water 302 such that the direction of motion of the pressure waves is perpendicular (or substantially perpendicular) to the substrate surfaces so that cavitation can occur at the substrate surfaces, thus enhancing the cleaning of the substrate surfaces.

The cleaning monitor 305 is positioned in the tank 303. As described in more detail below, the cleaning monitor 305 obtains information regarding the state of one or more physical characteristics within the water 302 from which conclusions can be drawn regarding the effectiveness of the megasonic cleaning. The cleaning monitor 305 outputs a signal representing this information to the system controller 301.

The system controller 301 can be configured to automatically process the received information and take appropriate action. For example, the system controller 301 can, based upon the information received from the cleaning monitor 305, cause the RF generator 304 to generate an electrical signal of a different frequency and/or amplitude, which, in turn, causes corresponding changes in the frequency and/or amplitude of the vibrations generated by the transducer 306 and, consequently, the pressure wave produced in the water 302, thereby effecting real-time control of the megasonic cleaning process. Or, the system controller 301 can cause the operation of the megasonic cleaning system 300 to cease if the information received by the system controller 301 indicates that a predetermined criterion or criteria have been met (e.g., the magnitude of a specified quantity or quantities, such as the measured frequency and/or amplitude of a pressure wave within the cleaning fluid, exceeds or drops below a specified threshold value). In either of the above cases, an alarm could be triggered if a predetermined criterion or criteria have been met.

Alternatively, the system controller 301 can simply display (and process, if necessary or desired) information received from the cleaning monitor 305, leaving corrective action to be taken, if necessary, manually by an operator. Such display can—and, it is anticipated, typically will—be implemented even where the system controller 301 is configured for real-time control.

It is also desirable for the system controller 301 to include a high pass filter that filters low frequency components (i.e., components having a frequency magnitude—e.g., megasonic frequencies in the 800–1200 kHz range—below that which is likely to be characteristic of the pressure wave in the water 302) out of the signal from the cleaning monitor 305.

Generally, the cleaning monitor 305 can be constructed to obtain information regarding the state of any physical characteristic of the water (or other fluid in which the substrates are immersed) which can be analyzed to enable evaluation of the effectiveness of the megasonic cleaning.

For example, as described in more detail below, the cleaning monitor 305 can include a mechanism that determines the acceleration of a pressure wave produced in the water 302 by the vibrations. Such a mechanism can measure the acceleration of the pressure wave directly (see FIG. 4A and the accompanying description below) or indirectly (see FIG. 4B and the accompanying description below). From acceleration measurements made over a period of time, the amplitude and frequency of the pressure wave can be determined. As is best understood, as the amplitude (and, to a lesser extent, the frequency) of the pressure wave in a cleaning fluid such as water 302 increases, the agitation at the surface of the object being cleaned increases (in particular, because the increased amplitude and/or frequency produces larger cavitation bubbles at the surface), thus resulting in increased cleaning effectiveness. Thus, the amplitude and/or frequency can be monitored to ensure that the magnitude of the amplitude and/or frequency stays above a specified threshold level that is deemed to produce acceptable cleaning.

Or, for example, as also described in more detail below, the cleaning monitor 305 can be implemented by a mechanism that detects the formation of bubbles on a surface that is immersed in the water 302 and that is perpendicular (or substantially perpendicular) to the direction of motion of the pressure wave in the water 302. Since the substrates 307 are positioned so that the substrate surfaces to be cleaned are also perpendicular to the direction of motion of the pressure wave, surface bubble formation on the substrate surfaces is assumed to occur in the same manner as it occurs on the surface that is monitored by the cleaning monitor 305. From the detection of surface bubble formation, information regarding the size of the surface bubbles and/or the frequency of surface bubble formation can be determined. As is best understood, as the size of the surface bubbles (and, to a lesser extent, the frequency of formation of the surface bubbles) increases, the agitation at the surface of the object being cleaned increases, thus resulting in increased cleaning effectiveness. Thus, the surface bubble size and frequency of formation can be monitored to ensure that the magnitude of the size and/or frequency of formation stays above a specified threshold level that is deemed to produce acceptable cleaning.

The cleaning monitor 305 can be implemented as a portable device that is not attached to the megasonic cleaning system 300 or as a dedicated device that is permanently affixed as part of the megasonic cleaning system 300. A portable device can be advantageous because a portable device can easily be used to monitor multiple cleaning systems. A portable device can also be advantageous because a portable device may be less expensive than a dedicated device. A dedicated device can be advantageous because a dedicated device can be ready for use with less preparation (e.g., there is no need to retrieve the device and position the device in the tank 303). A dedicated device can also be advantageous because a dedicated device can be operated in a consistent manner (e.g., positioned in the same location) each time that the device is used. A dedicated device can also be advantageous because a dedicated device can easily monitor the effectiveness of a cleaning system at all times that the system is operating, thus enabling ineffective cleaning to be detected as soon as it occurs.

Figure 4A:
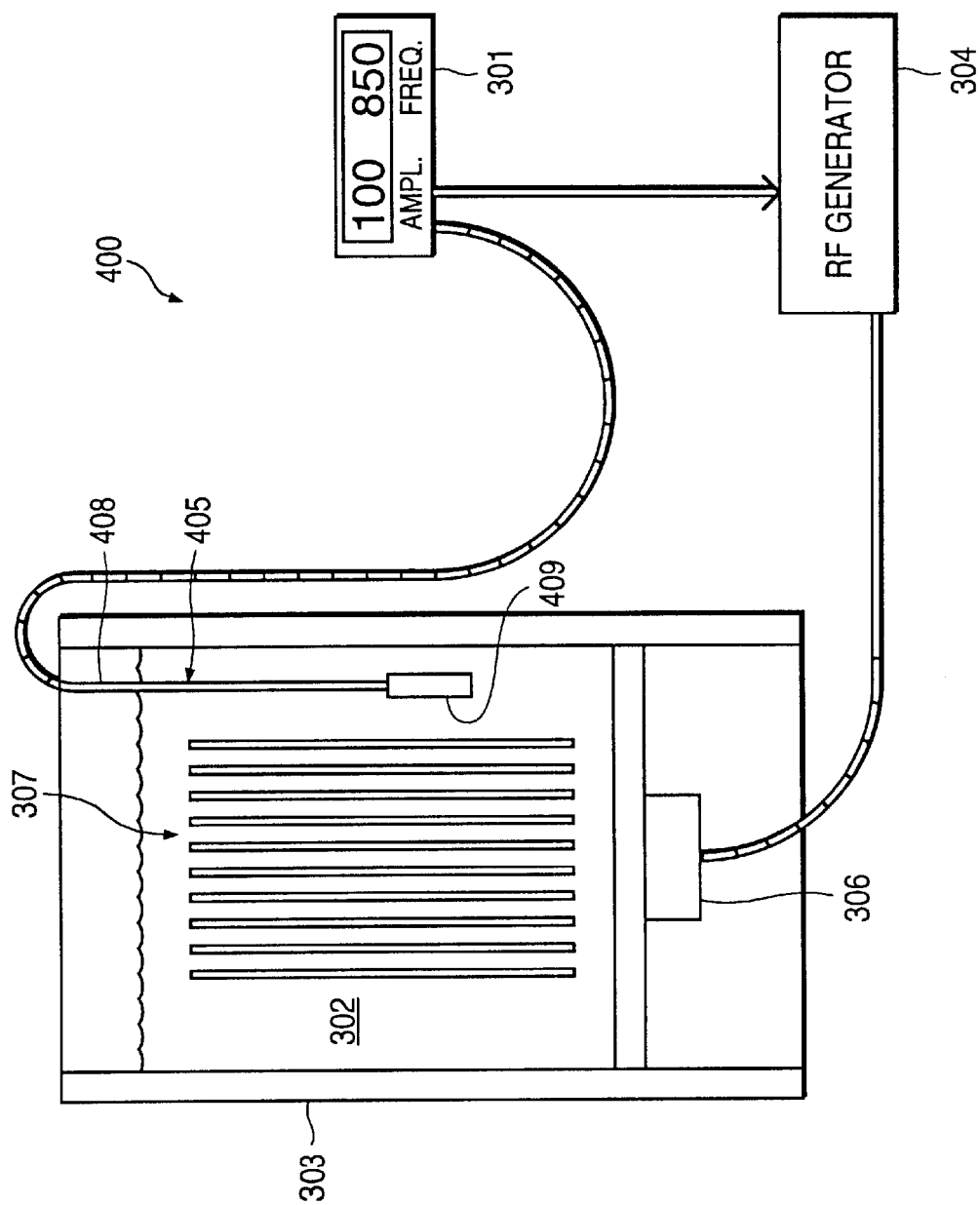
FIGS. 4A and 4B are each a block diagram illustrating a cleaning system including a cleaning monitor according to an embodiment of the invention in which the monitor includes a mechanism that enables determination of the acceleration of a pressure wave produced in a fluid in a tank of the cleaning system.
Figure 4B:
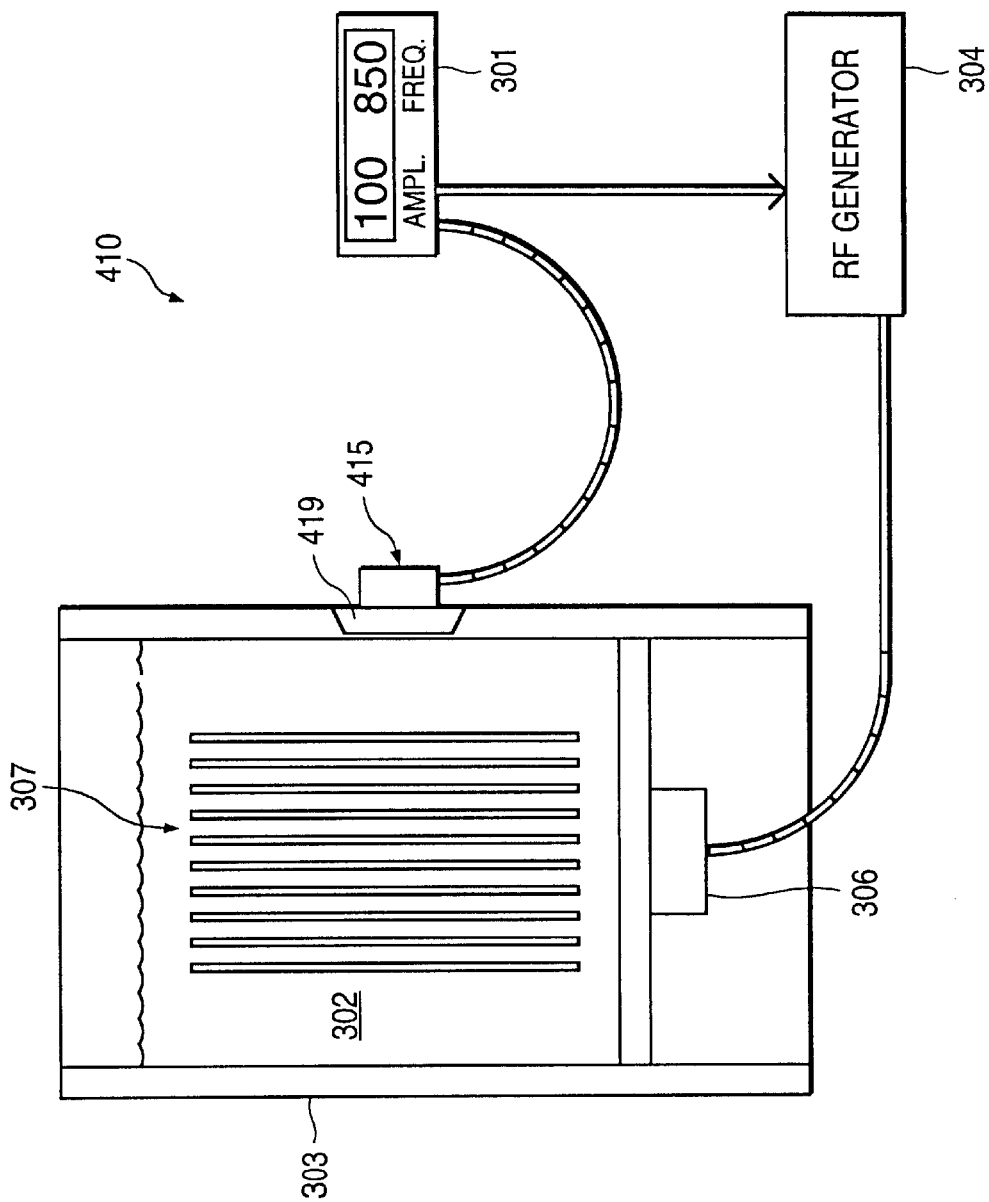

FIGS. 4A and 4B are each a block diagram illustrating a megasonic cleaning system (megasonic cleaning systems 400 and 410, respectively) including a cleaning monitor (cleaning monitors 405 and 415, respectively) according to an embodiment of the invention in which the monitor includes a mechanism (sensors 409 and 419, respectively) that enables determination of the acceleration of a pressure wave produced in a cleaning fluid (water 302, as illustrated in FIGS. 4A and 4B) in which the objects to be cleaned (substrates 307, as illustrated in FIGS. 4A and 4B) are immersed. In FIGS. 3, 4A and 4B (as well as FIGS. 5A and 5B described below), like components are designated by the same numerals. Generally, the megasonic cleaning systems 400 and 410 operate in the same manner as described above with respect to FIG. 3.

In FIG. 4A, the sensor 409 of the cleaning monitor 405 is mounted on a wand 408 such that the sensor 409 can be positioned in the water 302. The wand 408 can be any device made of any material having appropriate characteristics (e.g., appropriate stiffness and strength) that enable the cleaning monitor 405 to perform the functions for which the cleaning monitor 405 is intended. For example, if the sensor 409 is configured to measure the acceleration of the sensor 409 (or the combination of the sensor 409 and the wand 408), the wand 408 should be sufficiently flexible to allow the sensor 409 to move freely with the vibrations of the water 302. The sensor 409 can be mechanically attached to the wand 408 in any manner that is appropriate for the devices used to implement the sensor 409 and wand 408, as can be readily apprehended by those skilled in the art. Further, the combination of the wand 408 and sensor 409 should be constructed so as not to have a natural frequency having a harmonic that is within the range of frequencies expected to be measured by the sensor 409. As is also readily apparent to those skilled in the art, conventional electrical cable or wire can be attached on or within the wand 408, and extend from the wand 408 to the system controller 301, to enable an electrical signal from the sensor 409 to be communicated to the system controller 301.

The sensor 409 must be implemented by a device that is not detrimentally affected by contact with water. The sensor 409 must also be adapted for measurement of frequencies of a magnitude (e.g., in a megasonic cleaning system, frequencies in the 800–1200 kHz range) that are likely to be characteristic of the pressure wave in the water 302. Additionally, the sensor 409 must be properly oriented within the water 302 to enable measurement of acceleration in the direction of motion of the pressure wave. The sensor 409 can be implemented so as to measure the acceleration of the pressure wave in the water 302 or so as to measure the acceleration of the sensor 409 itself (or the combination of the sensor 409 and wand 408). The sensor 409 can be implemented by, for example, a conventional piezoelectric transducer (of waterproof construction, having appropriate frequency characteristics and positioned with the proper orientation) that is adapted to receive a mechanical input (e.g., pressure exerted by a surrounding body of water) and produce an electrical signal that represents the magnitude of the mechanical input.

As can be readily appreciated, the cleaning monitor 405 illustrated in FIG. 4A can be a portable handheld device that an operator holds in place during operation of the cleaning monitor 405. Alternatively, the cleaning monitor 405 can be fixedly attached to, for example, the tank 303 so that the cleaning monitor 405 is held in place during operation without operator interaction.

In FIG. 4B, the sensor 419 of the cleaning monitor 415 is mounted on a wall of the tank 303. The sensor 419 senses the acceleration of the wall of the tank 303 (which corresponds to the acceleration of the pressure wave produced in the water 302 by the vibrations, thus enabling determination of the amplitude and frequency of the pressure wave in the water 302). The sensor 419 should be constructed subject to the limitations regarding operating frequency range and natural frequency harmonics discussed above with respect to the sensor 409. Like the sensor 409, the sensor 419 can be implemented by, for example, a conventional piezoelectric transducer that is adapted to receive a mechanical input and produce a corresponding electrical signal. The sensor 419 can be mounted within the tank 303 so that the sensor 419 is immersed in the water 302, or the sensor 419 can be mounted outside of the tank 303. The latter implementation may be desirable because it is not necessary that the sensor 419 be implemented by a waterproof device, thus typically enabling an implementation of the sensor 419 that is simpler and more inexpensive than would otherwise be the case and eliminating safety concerns associated with operating an electrical device in water. The sensor 419 can be mounted on the wall in any appropriate manner: for example, the sensor 419 can be attached to the wall with nuts and bolts or other similar fasteners. Further, it may be desirable to modify the thickness of the wall on which the sensor 419 is mounted (e.g., make the wall thinner) to reduce any attenuation of the transmission of the acceleration of the pressure wave to the wall. As for the cleaning monitor 405 of FIG. 4A, conventional electrical cable or wire can be attached between the sensor 419 and the system controller 301 to enable an electrical signal from the sensor 419 to be communicated to the system controller 301.

In embodiments of the invention as described above with respect to FIGS. 4A and 4B, it may be desirable to position the sensor at a particular location. In particular, it may be desirable to position the sensor at a particular location relative to the object or objects being cleaned. For example, when the sensor is positioned in the cleaning fluid (as in FIG. 4A), it may be desirable to position the sensor as close to one of the substrates as thought to be possible without interfering with the cleaning of that substrate. Alternatively, it may be desirable to position the sensor as far from all of the substrates as possible to ensure that the sensor does not interfere with the cleaning of the substrates. It may also be desirable, when substrates are positioned as shown in FIGS. 4A and 4B, to position the sensor along a vertical (as viewed in FIGS. 4A and 4B) axis at a location that is opposite the center of the substrates (sensor 419 is shown in this location in FIG. 4B, while sensor 409 is shown positioned just below such a location in FIG. 4A), since the measurements made at such central location may best represent, on average, the characteristics of the pressure wave experienced by the objects being cleaned. When the sensor is positioned in the cleaning fluid, the distance of the sensor from other parts of the megasonic cleaning system (e.g., the walls of the tank 303) may also need to be taken into account. For example, it may be desirable to position the sensor at a location that is a specified minimum distance from other parts of the megasonic cleaning system if it is believed (or known) that such parts affect the magnitude of the pressure waves such that a measurement by the sensor within such minimum distance does not provide an accurate measurement of the magnitude of the pressure wave that is experienced by the objects being cleaned.

Figure 5A:
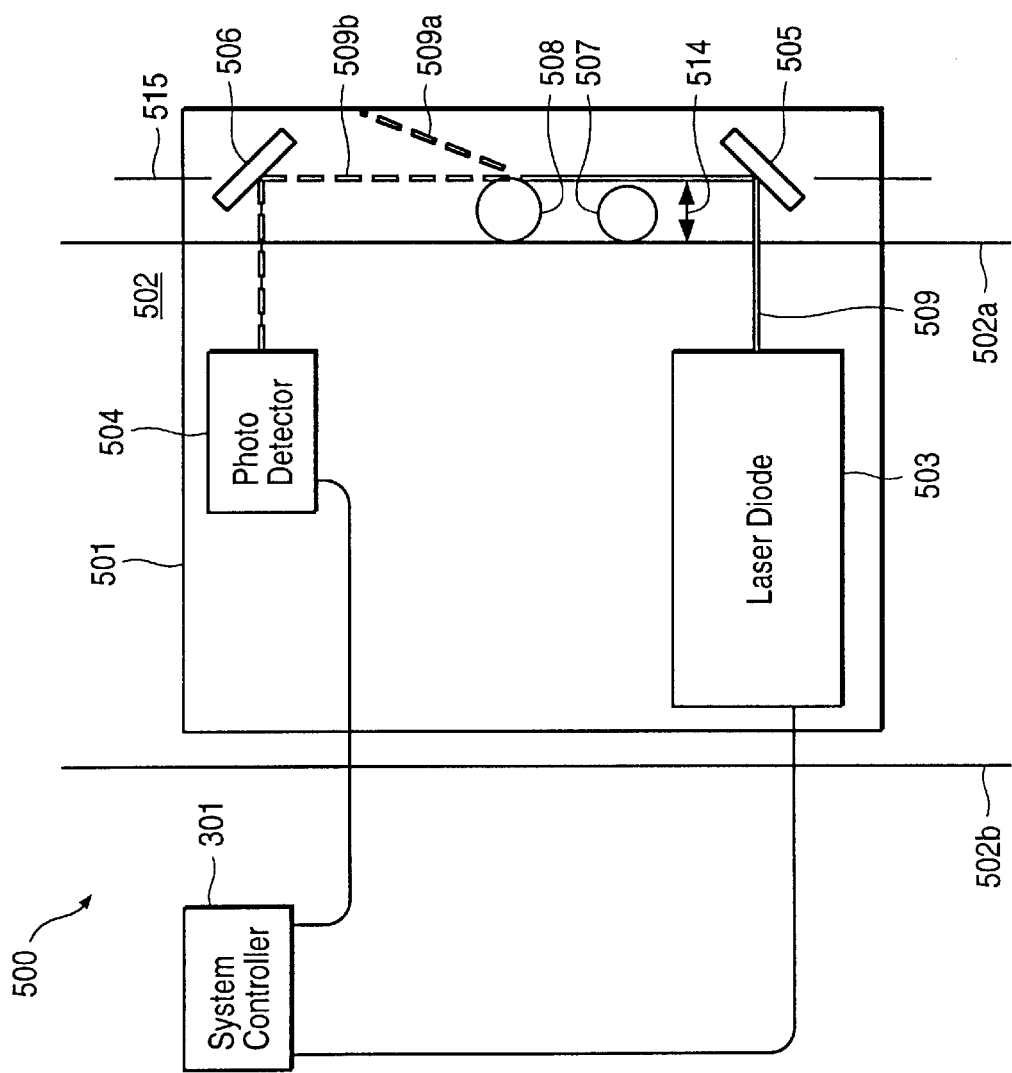
FIGS. 5A and 5B are each a block diagram illustrating a cleaning monitor according to an embodiment of the invention in which the monitor includes a mechanism that detects the formation of a bubble on a surface that is immersed in a fluid used in a cleaning system with which the monitor is being used.
Figure 5B:
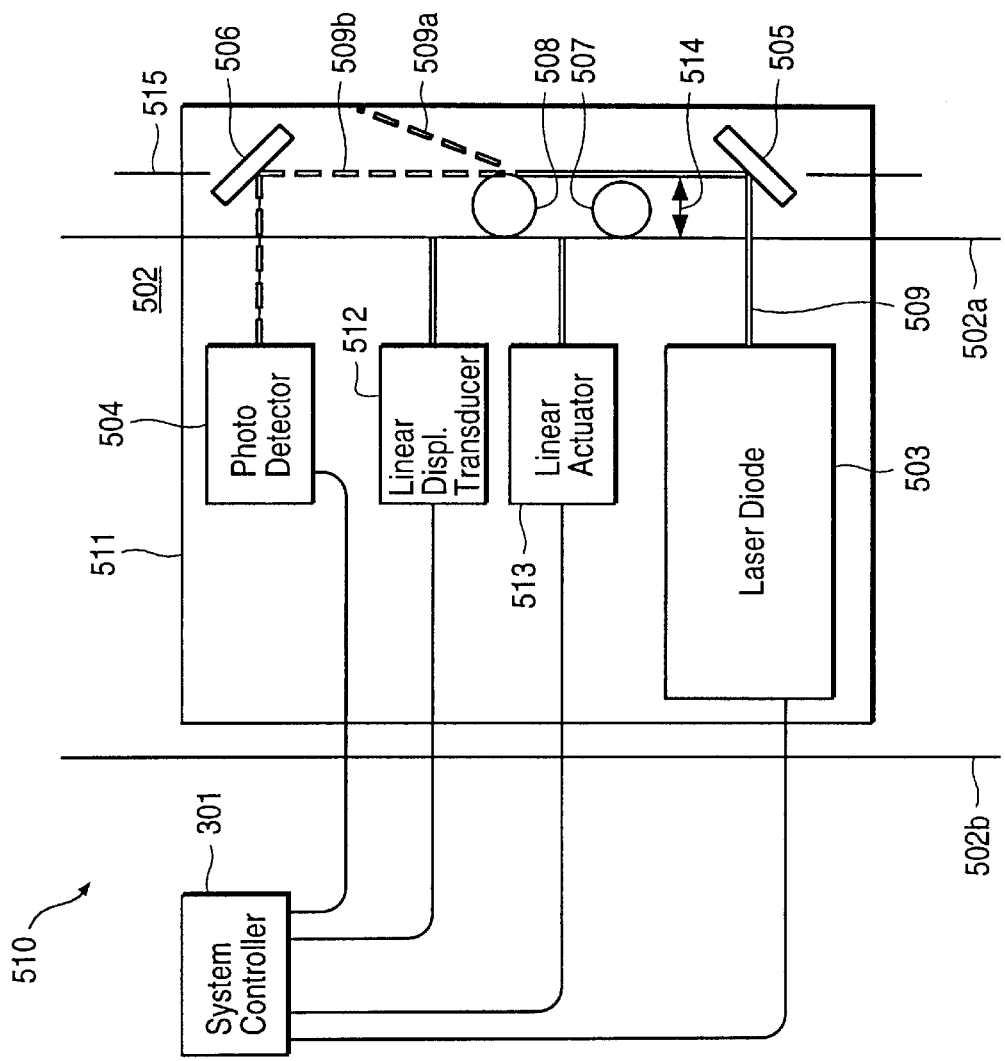

FIGS. 5A and 5B are each a block diagram illustrating a cleaning monitor (cleaning monitors 500 and 510, respectively) according to an embodiment of the invention in which the monitor includes a mechanism (sensors 501 and 511, respectively) that detects the formation of a bubble on a surface (e.g., wand surface 502a) that is immersed in a cleaning fluid used in a cleaning system with which the monitor is being used. The cleaning monitors 500 and 510 can be used with a megasonic cleaning system that operates in the same manner as described above with respect to FIG. 3, or with any other appropriate cleaning system as described elsewhere herein.

In FIG. 5A, the sensor 501 includes a laser diode 503, photodetector 504, and mirrors 505 and 506, each of which are attached to a wand 502 (as shown in FIGS. 5A and 5B, defined by surfaces 502a and 502b). The wand 502 can be implemented as described above with respect to wand 408 (FIG. 4A). The components of the sensor 501 (laser diode 503, photodetector 504, and mirrors 505 and 506) can be implemented by conventional such components, as known to those skilled in the art, some of which may need to be matched with each other (e.g., the frequency of the laser diode 503 and photodetector 504), as also known to those skilled in the art. The components of the sensor 501 can be attached to the wand 502 in any appropriate manner, such as with machine screws; however, they must be positioned with respect to each other so as to enable operation of the sensor 501, as described below. If the components of the sensor 501 will be immersed in the cleaning fluid (as will typically be the case, as described below), they must be implemented so as not to be detrimentally affected by contact with the cleaning fluid. Conventional electrical cable or wire can be attached on or within the wand 502, and extend from the wand 502 to the system controller 301, to enable electrical signals to be communicated between the sensor 501 and the system controller 301.

The laser diode 503 (or other similar light source, such as, for example, a fiberoptic cable that delivers high intensity light) emits a collimated light beam 509 in a direction such that the light beam 509 strikes the mirror 505. The mirror 505 is positioned at an angle with respect to the wand surface 502a and the laser diode 503 so that the light beam 509 is reflected by the mirror 505 along an axis 515 that is parallel (or substantially parallel) to the wand surface 502a. The mirror 506 is positioned so that the reflected light beam 509 from the mirror 505 strikes the mirror 506. The mirror 506 is oriented at an angle so that the light beam 509 is reflected by the mirror 506 toward the photodetector 504. The photodetector 504 senses the intensity of the light beam 509 and transmits an electrical signal representative of that intensity to the system controller 301.

In addition to being positioned at an appropriate angle as indicated above, the mirror 505 is positioned at a location such that the axis 515 is a predetermined desired distance 514 from the wand surface 502a. As will be understood from the description below, the distance 514 corresponds to the smallest diameter bubble formed on the wand surface 502a that is desired to be capable of detection by the sensor 501.

Further, the mirrors 505 and 506 are preferably positioned sufficiently far apart to ensure that the mirrors 505 and 506 do not interfere with the movement of the pressure wave in the region being monitored by the sensor 501, or with the surface bubble formation in that region. Illustratively, a distance of approximately 0.5 inches between the mirrors 505 and 506 is believed to be more than adequate to satisfy these criteria.

During operation of the cleaning monitor 500, the wand 502 is positioned such that the sensor 501 is immersed in the cleaning fluid. The wand 502 is also positioned in the cleaning fluid such that the wand surface 502a is substantially perpendicular to the direction of motion of the pressure wave produced in the cleaning fluid, so that bubbles can be formed on the wand surface 502a by cavitation, as described above. When no bubbles are formed on the wand surface 502a (e.g., if the wand 502 is immersed in the cleaning fluid when vibrations are not being applied), the light beam 509 passes uninterrupted from the laser diode 503 to the photodetector 504, registering a particular magnitude of intensity (hereafter termed the "baseline intensity") at the photodetector 504 for a particular magnitude of intensity emitted from the laser diode 503.

In FIG. 5A, a bubble 507 is shown formed on the wand surface 502a. The bubble 507 is sufficiently small so that the light beam 509, when reflected from the mirror 505, does not pass through the bubble 507. Thus, the intensity of the light beam 509 detected by the photodetector 504 remains the same as the baseline intensity.

FIG. 5A also illustrates a bubble 508 formed on the wand surface. The bubble 508 is larger than the bubble 507. (Bubbles of different sizes would typically be formed at different times; the bubbles 507 and 508 are shown together in FIG. 5A for simplicity of illustration). The bubble 508 is sufficiently large so that the reflected light beam 509 from the mirror 505 impinges upon the bubble 508. The bubble 508 causes part of the light beam 509 to reflect (as shown by the beam 509a); the other part of the light beam 509 passes through the bubble 508 (as shown by the beam 509b). Since only part of the light beam 509 passes through the bubble 508, the intensity of light detected by the photodetector 504 is less than the baseline intensity.

Thus, as can be appreciated from the above description, the sensor 501 enables detection of the formation of surface bubbles having a diameter that is greater than or equal to the distance 514, such detection being indicated when the photodetector 504 detects a light intensity that is less than the baseline intensity. (In practice, it may be desirable to establish a threshold "detection" intensity that is somewhat less than the baseline intensity to allow for fluctuations in the detected intensity that are due to causes other than the presence of a surface bubble in the path of the light beam 509.) As is currently understood in the art, the efficacy of megasonic cleaning increases as the size of the bubbles formed on the surfaces of the objects being cleaned increases. (This may also be true for cleaning using vibrations having other frequencies, e.g., ultrasonic cleaning.) The distance 514 can therefore be specified to enable monitoring of the size of the bubbles being formed on surfaces in the cleaning fluid to ensure that the size remains above a predetermined magnitude.

Cleaning effectiveness can also be related to the frequency of surface bubble formation. The sensor 501 also enables determination of the frequency with which the surface bubbles are formed, thus enabling the effectiveness of the cleaning process to be monitored in this way as well.

The surface bubble size and frequency of formation can be displayed by the system controller 301 and/or used by the system controller 301 to automatically control the cleaning process.

The cleaning monitor 500 enables determination of whether bubbles are being formed on the wand surface 502a that have at least a diameter equal to the distance 514 between the wand surface 502a and the axis 515. It may further be possible to determine the size of a surface bubble having a diameter that is larger than the distance 514 by analyzing the intensity of the light beam 509 measured by the photodetector 504. The light intensity measured by the photodetector 504 equals the intensity of the light beam 509 produced by the laser diode 503 minus any amount absorbed by the cleaning fluid and bubble (which may be a quantifiable function of the composition of the cleaning fluid) and any amount reflected or refracted away by the bubble (which may be a quantifiable function both of the composition of the cleaning fluid and the angle of the surface of the bubble where the light beam 509 strikes the bubble). With knowledge, then, of the composition of the cleaning fluid, it may be possible to infer the angle at which the light beam 509 strikes the bubble surface from the magnitude of the intensity measured by the photodetector 504 and, therefore, assuming that the bubble is circular, the diameter of the bubble. However, it is not possible to determine the size of a surface bubble having a diameter that is smaller than the distance 514. In any event, it would be desirable to be able to determine with accuracy the size of the surface bubbles being formed in the cleaning fluid. FIG. 5B illustrates a cleaning monitor 510 that is similar to the cleaning monitor 500, but that has a sensor 511 that includes a mechanism that is particularly adapted to enable determination of the size of the surface bubbles being formed in the cleaning fluid.

In FIG. 5B, the sensor 511 includes—in addition to the laser diode 503, photodetector 504, and mirrors 505 and 506 that are part of the sensor 501—a linear displacement transducer 512 and a linear actuator 513, which can also be attached to the wand 502. Generally, the sensor 511 is constructed and operates in the same manner as the sensor 501, as described above. However, in addition, the linear actuator 513 can cause the wand surface 502a and the mirrors 505 and 506 (in particular, the axis 515) to move with respect to each other in response to a control signal from the system controller 301. To accomplish such movement, the wand surface 502a can be moved, the mirrors 505 and 506 can be moved, or both the wand surface 502a and the mirrors 505 and 506 can be moved. The linear actuator 513 (which can be, for example, a solenoid-operated motor) is operably connected to the wand surface 502a and/or the mirrors 505 and 506 in any appropriate manner, as can readily be accomplished by those skilled in the art, in order to effect such movement. The linear displacement transducer 512 (which can be, for example, a conventional encoder on the motor) senses the movement of the wand surface 502a relative to the axis 515 and transmits an electrical signal to the system controller 301 representing the magnitude of the actual movement. The system controller 301 can then transmit an appropriate signal to the linear actuator 513, if necessary, to correct the position of the wand surface 502a relative to the axis 515 so that the actual position matches the commanded position, thus effecting feedback control of the relative positioning of the wand surface 502a and axis 515.

As the wand surface 502a is moved relative to the axis 515, the distance 514 changes and, therefore, the minimum bubble size that can be detected changes. In operation of the cleaning monitor 510, the distance 514 is initially made sufficiently large to ensure that the initial distance 514 will be larger than the largest possible bubble size. The distance 514 is then gradually decreased. When the distance 514 equals the diameter of the bubbles being formed on the wand surface 502a, the intensity of the magnitude of the light beam 509 that is detected by the photodetector 504 will change, as described above, indicating the presence of a surface bubble (and, correlatively, the diameter of such bubble).

The cleaning monitors 500 and 510 are described above with respect to embodiments in which the sensors 501 and 511 are attached to, and measure formation of bubbles on, the surface of a wand 502 that is immersed in a fluid in a megasonic cleaning tank. Cleaning monitors that work functionally in the same manner could also be implemented by attaching the sensors to a wall of a megasonic cleaning tank. In such embodiments, the sensors could advantageously be constructed to monitor the formation of bubbles on the wall to which the sensors are attached (assuming that the walls are substantially perpendicular to the direction of motion of the pressure wave). The operation and use of such cleaning monitors would be the same as, or similar to, the cleaning monitors 500 and 510 described above.

It may also occur that bubbles ("off-surface bubbles") are formed in a cleaning fluid away from surfaces immersed in the cleaning fluid. In particular, off-surface bubbles may be formed at locations that are sufficiently proximate to regions at which the formation of surface bubbles is being detected, so that the off-surface bubbles can also be detected by the mechanism being used to detect formation of surface bubbles. However, since the pressure fluctuations at the immersed surfaces are typically much greater than those at locations away from the surfaces, the incidence of off-surface bubbles, if any, is typically infrequent enough so that the detection of surface bubble formation is not appreciably affected. Thus, for example, if off-surface bubbles are being detected when surface bubbles are not being detected, the frequency of bubble detection will be so low that it can be discerned that off-surface bubbles are being detected rather than surface bubbles. Similarly, if off-surface bubbles are being detected when surface bubbles are being detected, the frequency of off-surface bubble detection will be so low that it will affect the measured frequency of bubble formation by an insignificant amount.

Generally, the invention can be used with any cleaning system and method in which vibrations are applied to a volume of fluid in which an object to be cleaned is at least partially immersed. For example, the invention can be used with megasonic and ultrasonic cleaning systems and methods, as indicated above. Herein, a "megasonic" cleaning system or method can be any system or method in which the vibrations applied to the cleaning fluid have a frequency that is understood by those skilled in the art to be a megasonic frequency. For example, a "megasonic" cleaning system or method can be a system or method in which the vibrations applied to the cleaning fluid have a frequency above about 100 kHz, and, in particular, between about 800 kHz and about 1200 kHz, between about 800 kHz and about 1000 kHz, or between about 800 kHz and about 900 kHz. Herein, an "ultrasonic" cleaning system or method can be any system or method in which the vibrations applied to the cleaning fluid have a frequency that is understood by those skilled in the art to be a ultrasonic frequency. For example, an "ultrasonic" cleaning system or method can be a system or method in which the vibrations applied to the cleaning fluid have a frequency below about 100 kHz. Megasonic and ultrasonic cleaning systems with which the invention can be used are available commercially from a large number of sources, such as, for example, AIO Microservice, Inc. of Fremont, Calif.; Blue Wave Ultrasonic of Davenport, Iowa; Branson Ultrasonics Corp. of Danbury, Conn.; CFM Technologies, Inc. of West Chester, Pa.; Crest Ultrasonics Corp. of Trenton, N.J.; Flocept of Bloomington, Minn.; Interlab, Inc. of Danbury, Conn.; Intersurface Dynamics, Inc. of Bethel, Conn.; Ontrak Systems, Inc. of San Jose, Calif.; PCT Systems, Inc. of Fremont, Calif.; S&K Products International, Inc. of Chestnut Ridge, N.Y.; Semitool, Inc. of Kalispell, Mont.; Silicon Technology Corp. of Oakland, N.J.; Sonicor Instrument Corp. of Copiague, N.Y.; Steag MicroTech of Kalispell, Mont.; Transene Co., Inc. of Danvers, Mass.; Valtech Corp. of Pughtown, Pa.; Verteq, Inc. of Santa Ana, Calif.; and SubMicron Systems of Allentown, Pa. Megasonic cleaning systems and methods with which the invention may be used are also described in, for example, U.S. Pat. Nos. 5,090,432; 5,148,823; 5,247,954; 5,365,960; 5,520,205; 5,427,622; 5,286,657; 5,533,540; 5,534,076; 5,579,792; 4,326,553; 4,543,130; 4,736,759; 4,736,760; 4,869,278; and 5,037,481; as well as European Patent Application No. 92310248.7.

Additionally, the invention is described above as used with systems and methods for cleaning a substrate and, in particular, a semiconductor substrate such as a semiconductor wafer. However, generally, the invention can be used with systems and methods that make use of megasonic energy to clean objects of any type.

Further, the invention has been described above as implemented with a megasonic cleaning system in which the cleaning fluid is water, and, in particular, deionized water, such as is conventionally used in cleaning semiconductor substrates. However, the invention can generally be used to monitor the cleaning effectiveness of a megasonic cleaning system in which any type of cleaning fluid is used. For example, water other than deionized water can be used. Or, a liquid other than water (e.g., hydrofluoric acid) or a gas can be used. (This may necessitate the use of appropriately chemically resistant materials for components of the invention that are immersed in the cleaning fluid.) The amplitude and frequency of the pressure wave within a cleaning fluid that results in formation of surface bubbles of a size that produce optimum cleaning can vary with the particular fluid used. Since a cleaning monitor as illustrated and described above with respect to FIGS. 4A and 4B monitors the amplitude and frequency of the pressure wave as a proxy for surface bubble formation, it may be necessary to determine the pressure wave amplitude and frequency that produces optimum surface bubble formation (i.e., that produces optimum cleaning) for the particular cleaning fluid used before such cleaning monitor can be used effectively.

In the particular embodiments of the invention described above, a single cleaning monitor is used to monitor the operation of a cleaning system. However, multiple cleaning monitors could be used with a single cleaning system. Further, it may be desirable to space such multiple monitors sufficiently far apart from one another to enable information regarding cleaning effectiveness to be obtained throughout the volume of cleaning fluid. The information from each monitor can be evaluated individually to enable increased granularity in the monitoring of cleaning effectiveness and/or the information from the multiple monitors can be combined (e.g., averaged) to provide an overall assessment of cleaning effectiveness that, typically, would be expected to be more accurate than that provided by a single cleaning monitor.

Various embodiments of the invention have been described. The descriptions are intended to be illustrative, not limitative. Thus, it will be apparent to one skilled in the art that certain modifications may be made to the invention as described above without departing from the scope of the claims set out below.

I claim:

1. A system for cleaning an object that is at least partially immersed in a volume of fluid, comprising:

means for applying vibrations to the volume of fluid; and means for monitoring the state of a physical characteristic of the fluid during the application of the vibrations, comprising;

means for sensing the state of the physical characteristic comprising means for determining the acceleration of a pressure wave produced in the volume of fluid by the vibrations; and means for producing information regarding the state of the physical characteristic.

2. A system as in claim 1, wherein the means for monitoring further comprises means for evaluating the produced information.

3. A system as in claim 2, further comprising means for controlling the means for applying vibrations, wherein the means for controlling is operable in response to the evaluation of the produced information.

4. A system as in claim 1, wherein the means for determining comprises means for directly measuring the acceleration of the pressure wave produced in the volume of fluid by the vibrations.

5. A system as in claim 1, wherein the means for determining comprises means for measuring the acceleration of a wall of an apparatus containing the volume of fluid, whereby the acceleration of a pressure wave produced in the volume of fluid by the vibrations can be determined.

6. A system as in claim 1, wherein the means for producing information regarding the state of the physical characteristic comprises means for determining the amplitude and/or frequency of the pressure wave from the determined acceleration.

7. A system as in claim 1, wherein the means for sensing comprises means for detecting the formation of bubbles on a surface that is immersed in the fluid.

8. A system as in claim 7, wherein the means for producing information regarding the state of the physical characteristic comprises means for determining the size and/or the frequency of formation of the bubbles based upon the detection of bubble formation by the means for detecting.

9. A system as in claim 1, wherein the fluid is water.

10. A system as in claim 9, wherein the object is a semiconductor substrate.

11. A system as in claim 1, wherein the vibrations have a megasonic frequency.

12. A system as in claim 1, wherein the vibrations have an ultrasonic frequency.

13. A device for use in monitoring the effectiveness of a cleaning process in which vibrations are applied to a volume of fluid in which an object to be cleaned is at least partially immersed, comprising:

means for sensing the state of a physical characteristic of the fluid during the application of the vibrations, comprising means for determining the acceleration of a pressure wave produced in the volume of fluid by the vibrations; and means for producing information regarding the state of the physical characteristic.

14. A device as in claim 13, wherein the means for determining acceleration comprises a piezoelectric transducer.

15. A device as in claim 13, wherein the means for producing information regarding the state of the physical characteristic comprises means for determining the amplitude and/or frequency of the pressure wave from the determined acceleration.

16. A device as in claim 13, wherein the means for sensing further comprises means for detecting the formation of bubbles on a surface that is immersed in the fluid.

17. A device for use in monitoring the effectiveness of a cleaning process in which vibrations are applied to a volume of fluid in which an object to be cleaned is at least partially immersed, comprising:

means for detecting the formation of bubbles on a surface that is immersed in the fluid, wherein the means for detecting bubble formation comprises:

means for producing collimated light;

means for directing the collimated light along an axis that is substantially parallel to the surface and at a known distance from the surface such that the light passes through a specified region; and means for detecting the intensity of the collimated light after the light has passed through the specified region; and means for producing information regarding the state of the bubble formation.

18. A device as in claim 17, wherein:

the means for producing collimated light further comprises a laser diode;

the means for directing the collimated light further comprises a mirror; and the means for detecting the intensity of the collimated light further comprises a photodetector.

19. A device as in claim 17, wherein the means for detecting bubble formation further comprises means for varying the distance of the axis from the surface.

20. A device as in claim 17, wherein the means for producing information regarding the state of the physical characteristic comprises means for determining the size and/or the frequency of formation of the bubbles based upon the detection of bubble formation by the means for detecting.

21. A device as in claim 13, wherein the device is portable.

22. A device as in claim 13, wherein the device is permanently affixed as part of a cleaning system used to effect the cleaning process.

23. The device of claim 13, wherein the object comprises a semiconductor substrate.

24. The device of claim 13, wherein the vibrations have a megasonic frequency.

25. The system of claim 1, wherein the means for monitoring is portable.

26. The system of claim 1, wherein the means for monitoring is affixed to a tank containing said fluid.

* * * * *